(12) United States Patent
Moyer et al.

(10) Patent No.: US 7,668,029 B2
(45) Date of Patent: Feb. 23, 2010

(54) MEMORY HAVING SENSE TIME OF VARIABLE DURATION

(75) Inventors: William C. Moyer, Dripping Springs, TX (US); Perry H. Pelley, III, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 11/464,124

(22) Filed: Aug. 11, 2006

(65) Prior Publication Data
US 2008/0037343 A1 Feb. 14, 2008

(51) Int. Cl.
*G11C 7/00* (2006.01)
(52) U.S. Cl. .................... 365/203; 365/191; 365/207; 365/233.1
(58) Field of Classification Search ............... 365/203, 365/233.1, 233.11, 191
See application file for complete search history.

(56) References Cited

U.S. PATENT DOCUMENTS

| | | | |
|---|---|---|---|
| 4,751,407 A * | 6/1988 | Powell .................... 327/295 |
| 5,280,597 A | 1/1994 | Takata et al. | |
| 5,491,359 A * | 2/1996 | May et al. .................... 257/373 |
| 5,563,834 A | 10/1996 | Longway et al. | |
| 5,566,123 A | 10/1996 | Freiden et al. | |
| 5,631,577 A | 5/1997 | Freiden et al. | |
| 5,708,624 A | 1/1998 | Leung | |
| 5,729,160 A | 3/1998 | Allan | |
| 5,869,990 A | 2/1999 | Murabayashi et al. | |
| 5,943,290 A * | 8/1999 | Robinson et al. ............ 365/233 |
| 5,999,482 A | 12/1999 | Kornachuk et al. | |
| 6,061,293 A | 5/2000 | Miller et al. | |
| 6,072,732 A | 6/2000 | McClure | |
| 6,087,858 A | 7/2000 | Hunt et al. | |
| 6,115,789 A | 9/2000 | Durham et al. | |
| 6,130,847 A | 10/2000 | Huang et al. | |
| 6,160,743 A | 12/2000 | Parris | |
| 6,181,626 B1 | 1/2001 | Brown | |
| 6,201,757 B1 | 3/2001 | Ward et al. | |
| 6,282,131 B1 | 8/2001 | Roy | |
| 6,483,754 B1 | 11/2002 | Agrawal | |

(Continued)

OTHER PUBLICATIONS

PCT/US07/62549 International Search Report and Written Opinion mailed Sep. 29, 2008.

(Continued)

*Primary Examiner*—Hoai V Ho
*Assistant Examiner*—Kretelia Graham
(74) *Attorney, Agent, or Firm*—James L. Clingan, Jr.; Daniel D. Hill

(57) ABSTRACT

In one form a memory and method thereof has a memory array having a plurality of memory cells. A bit line precharge operation is based on a clock edge of an external clock signal. A word line is selected after the beginning of the precharge operation. A sense operation is begun after enabling the word line, where the sense operation is for sensing a logic state of a memory cell. A data bit is output from the memory array corresponding to the sensed logic state of the memory cell. In one form the bit line precharge operation further comprises the bit line precharge operation having a predetermined duration that is independent of the clock signal, and the sense operation begins a predetermined delay time after enabling the word line, the sense operation having a variable duration.

10 Claims, 2 Drawing Sheets

U.S. PATENT DOCUMENTS

| | | |
|---|---|---|
| 6,882,591 B2 | 4/2005 | Winograd et al. |
| 6,885,610 B2 | 4/2005 | Takayanagi |
| 6,952,040 B2 | 10/2005 | Chau et al. |
| 2003/0001219 A1 | 1/2003 | Chau et al. |
| 2004/0105292 A1 | 6/2004 | Matsui |
| 2004/0202039 A1 | 10/2004 | Takayanagi |
| 2004/0223354 A1 | 11/2004 | Lee |
| 2005/0249016 A1* | 11/2005 | Zanden et al. ......... 365/230.03 |
| 2007/0097780 A1* | 5/2007 | Chen et al. .................. 365/233 |

OTHER PUBLICATIONS

EPC Application No. 07757307.9 Supplemental EPC Search Report mailed Jun. 30, 2009.

Office Action on Related U.S. Appl. No. 11/392,402 mailed Dec. 27, 2007.

* cited by examiner

MEMORY HAVING SENSE TIME OF VARIABLE DURATION

RELATED APPLICATIONS

This application is related to U.S. patent application Ser. No. 11/392,402, titled "Memory with Clocked Sense Amplifier," filed Mar. 29, 2006, and assigned to the assignee hereof.

FIELD OF THE INVENTION

This invention relates to circuits, and more particularly, to memory circuits that have timing.

BACKGROUND OF THE INVENTION

Memory circuits have continued to have more and more bits of storage primarily due to the continued scaling of the processes used in making the memory circuits. The scaling below 0.1 micron feature size, which has reduced both transistor sizes and power supply voltage, has also resulted in memory arrays that have memory cells that provide differing signal strength. The differing strength has had an adverse impact on speed of operation, which is generally directly related to the time required to perform a read operation. This has been particularly exacerbated with operating frequencies exceeding one gigahertz (GHz). To maintain a given speed requirement, memory circuits generally have certain amounts of time allotted to each of the various elements required for performing a read operation. The primary time allocations are a time from a valid address to enabling a word line, a time to achieve a sufficient signal on the bit line(s), a time from sensing the signal on the bit lines to providing an output, and a time to precharge in preparation for the next time a word line is enabled. The typical approach for improving speed is to try to reduce the time required for these operations with a cycle beginning with responding to a valid address. This has been effective in providing speed improvements as transistor switching speeds have improved with scaling. Speed, however, is not just dependent on switching speeds of the transistors but also on the strength of the memory cells. The strength of the memory cells, however, is not uniform and sometimes some cells are just too weak to meet the speed requirements and the particular device must considered defective.

Thus, there is a need to reduce the number of defective devices and also to maintain improvements in speed with scaling.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a memory circuit begins a clock cycle by enabling precharge and terminating the sensing of the previous cycle. The result is that sensing is allowed to continue, after it begins, until the next cycle begins. Signal that is to be sensed is present on a bit line or a pair of bit lines. Longer time for developing the signal results in a bigger signal. The effect is that the logic state of a weaker memory cell is easier to sense if more time is available for developing the signal. With the sense amplifier being disabled by the beginning of the clock cycle, the time for developing the signal can be varied based on the clock cycle speed. Further if the other operations for reading such as precharge or driving the word line in response to an address are faster, there is more time for developing signal on the bit line(s). The result is that devices that have faster switching speeds can result in more time for signal development and thereby being able to detect the logic state of weaker memory cells. This is better understood by reference to the drawings and the following description.

Figure 1:
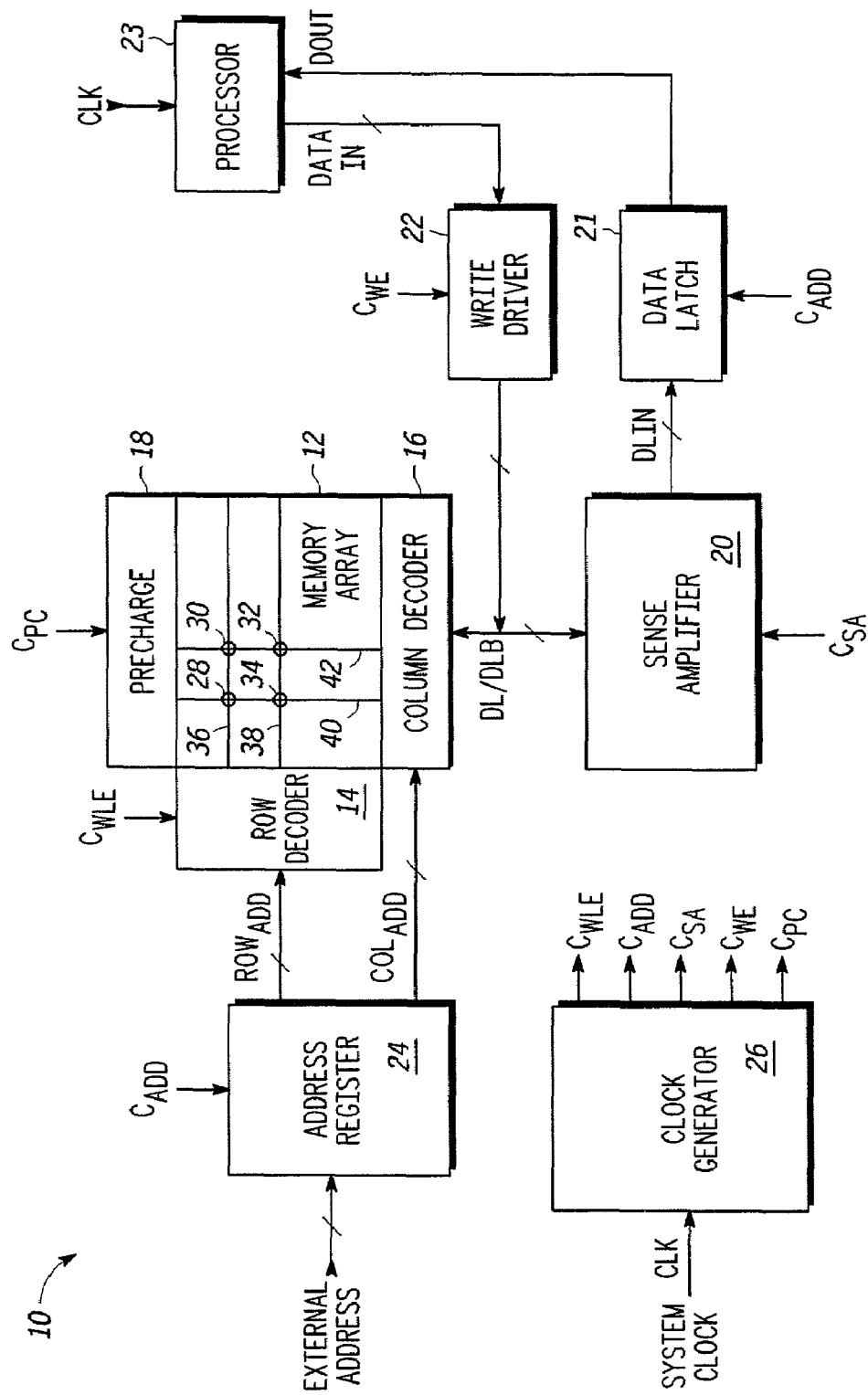
FIG. 1 is a memory circuit according to an embodiment of the invention.

Shown in FIG. 1 is a memory circuit 10 with a capability of operating at faster than one gigahertz and made with at least some transistor gate lengths below 0.1 micron comprising a memory array 12, a row decoder 14 coupled to array 12, a column decoder 16 coupled to array 12, a precharge circuit 18 coupled to array 12, a sense amplifier 20 coupled to column decoder 16, a data latch 21 coupled to sense amplifier 20, a write driver 22 coupled to column decoder 16, an address register 24 coupled to row decoder 14 and column decoder 16, and a clock generator 26 responsive to an external clock CLK for generating clock signals for row decoder 14, address register 24, precharge circuit 18, write driver 22, and sense amplifier 20. Also shown in FIG. 1 is a processor 23 coupled to data latch 21 and write driver 22. Further shown in FIG. 1 in memory array 12 are memory cells 28, 30, 32 and 34; word lines 36 and 38; and bit lines 40 and 42. Memory cells 28 and 30 are connected to word line 36. Memory cells 34 and 32 are connected to word line 38. Memory cells 28 and 34 are connected to bit line 40. Memory cells 30 and 32 are connected to bit line 42. Memory array 12 has many more memory cells located at intersections of many more bit lines and word lines than shown. It is not unusual for a memory array to have hundreds of millions of memory cells. The operation of memory array 12 and decoders 14 and 16 need not be anything unusual but can be a common memory such as a DRAM, SRAM, or a non-volatile memory. In the case of an SRAM, bit lines 40 and 42 would each be a complementary pair of bit lines connected to memory cells along a column. Memory 10 and processor 23 are primarily made up of transistors which have a gate length less than 0.1 micron. External clock CLK is able to operate at a frequency greater than 1 gigahertz (GHz).

In typical memory circuit fashion, address register 24 receives an external address and then provides a column address COLadd to column decoder 16, a row address ROWadd to row decoder 14. A word line selected by the row address enables cells along a row and the cells develop a signal on the bit line or bit lines to which they are connected. Column decoder 16 couples the developed signal to the sense amplifier which senses the developed signal on the selected bit line or bit lines and provides an output, data out of sense amplifier 20, corresponding to the developed signal. In the case of a write, clock generator 26 generates write enable clock signal CWE. When write driver 22 receives the write enable clock signal in an enabled state, write driver 22 provides data to column 16 to written into the cell or cells selected by column decoder 16.

Figure 2:
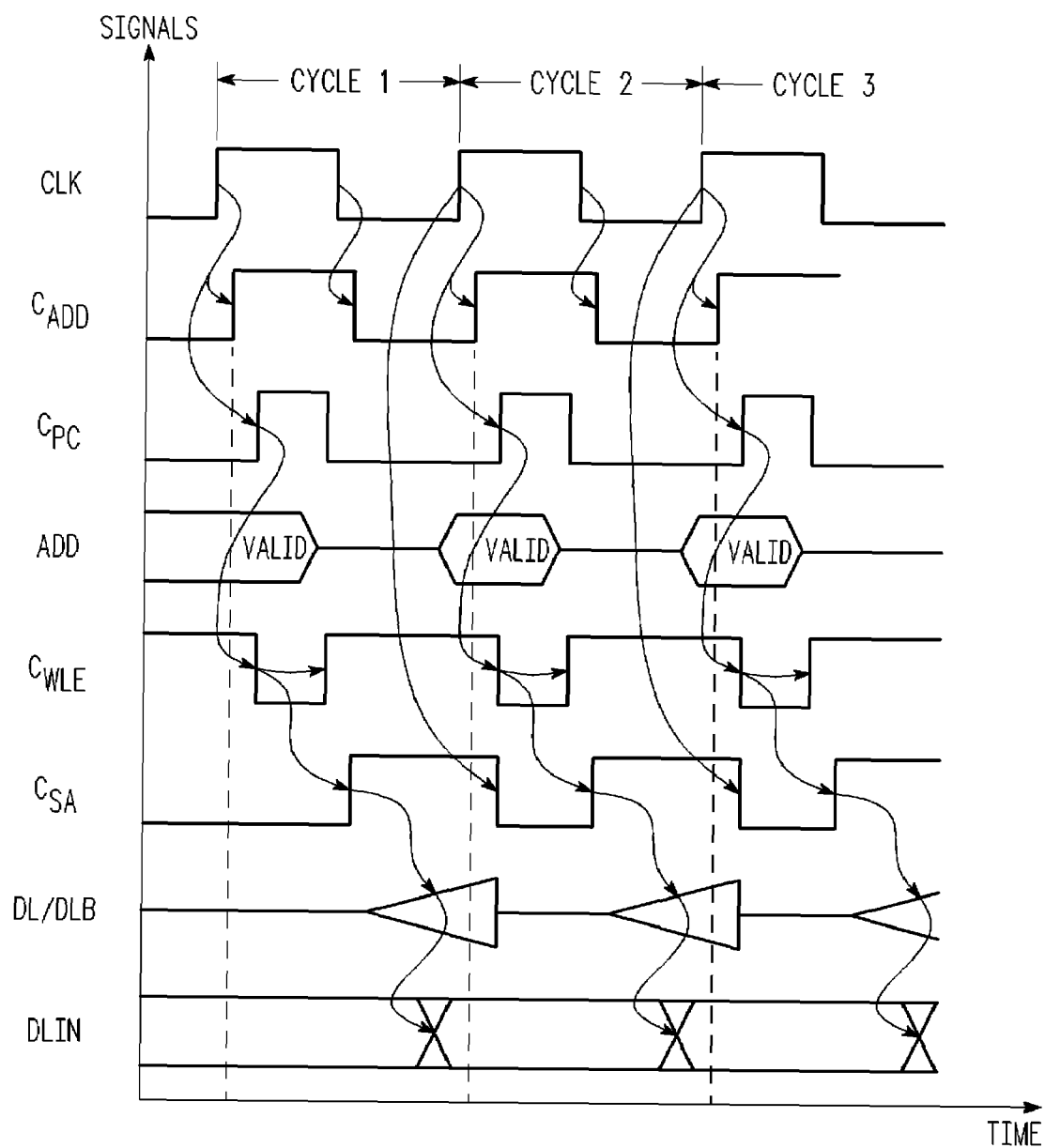
FIG. 2 is a timing diagram useful in understanding the operation of the memory circuit of FIG. 1.

The timing of the read operations provides benefits relating to speed, memory cell signal sensing margin, and devices that need not be considered defective for having weak memory bits. The description of the timing is aided by referencing the signals shown in the timing diagram of FIG. 2. Cycle 1 begins with the external clock CLK, also commonly called the system clock, switching to a logic high. In this example, Cycle 1 begins at the ending of a write operation and begins a read operation. The beginning of cycle 1 causes clock generator 26 to enable an address clock signal CADD and a precharge clock signal CPC. Address clock signal CADD enables the address register to provide the row and column addresses to row decoder 14 and column decoder 16, respectively. Precharge clock signal CPC enables precharge circuitry which precharges the bit lines, such as bit lines 40 and 42 of memory array 12. Clock generator 26 uses precharge clock CPC to disable a word line enable clock signal CWLE. This causes the word lines, such as word lines 36 and 38, of memory array 12 to be disabled. After a timed delay from the disabling of word line enable clock signal CWLE, word line enable clock signal CWLE is provided by clock generator 26 in an enabled state. This causes a word line selected by the row address to be enabled by row decoder 14. The enabling of a selected word line enables the memory cells along the selected word line to begin developing signal on the bit lines to which they are connected. Column decoder 16 couples the selected bit lines to sense amplifier 20 by way of data lines. The data lines in this example are shown as data lines DL and DLB which carry data as complementary signal. Sense amplifier 20 amplifies the signal received on data lines DL and DLB. Sense amplifier 20 is enabled by a sense enable clock signal CSE almost immediately after the selected word line is enabled. Thus, sense amplifier 20, being a static amplifier that continues sensing instead of latching in response to being enabled like a dynamic amplifier, almost immediately begins sensing the state being developed on the bit lines. This sensing continues until the next clock cycle begins. At the beginning of the next cycle, data latch 21 receives the output from sense amplifier 20 as a data latch in signal which is then latched in response to address clock signal CADD and provided as data out signal DOUT. Thus, sense amplifier 20 may continue sensing until the cycle is completed. Sense amplifier 20 has its sensing terminated in response to the end of the cycle. This termination of the end of cycle 1 is shown as disabling the sense amplifier clock signal CSA. Thus, data out signal DOUT is also provided in response to the termination of the cycle.

The next cycle, cycle 2, continues as described for cycle 1. At the beginning of cycle 2, the word line is disabled by disabling the word line enable clock signal CWLE and precharge clock CPC is enabled. The ending of sensing, the precharging, and the disabling of the word line occurs at substantially the same time. Precharging continues, in self-timed fashion by clock generator 26. The precharging lasts only as long as necessary. At the termination of the precharge by precharge clock signal CPC being disabled, row decoder 14 responds to the enabling of word line enable clock signal CWLE by enabling the word selected by the row address. With the selected word line enabled, the bit lines begin developing signal. Sense amplifier 20 is then enabled, also in a self-timed manner derived from word line enable clock signal CWLE. Thus, in response to the beginning of the cycle the precharging and enabling the word line occur for the time required and then sensing begins. Sensing continues based on the time for the next cycle to begin. Thus sensing in cycle 2 continues through the end of cycle 2 and is terminated in response to the beginning of cycle 3.

The effect of this particular embodiment is that the beginning of a current cycle, as indicated by the system clock CLK, begins a sequence of operations beginning with the enabling of the sense amplifier that provides a signal DILN representative of the logic state of the memory cell selected by the external address provided during the previous cycle. Also in response to the beginning of the current cycle but occurring after the sensing, the selected word line is enabled so that signal on the bit lines can be developed continuously until the beginning of the next cycle.

There are several benefits of this approach. In a typical memory, higher speeds for a given process occur when the channel lengths are shorter than the average for the particular manufacturing process. The result of the shorter channel lengths is faster switching speeds which has the effect of shortening the time required for addressing, decoding, and precharging. On the other hand, however, the shorter channel lengths for the switching transistors can also correlate to weaker memory cells, cells with less signal strength. Thus, the time for a sufficient signal to develop on the bit lines is increased. In the described example, the operations such as precharging, addressing, and decoding are speeded up so that the signal development begins earlier in the cycle and the signal development continues until the beginning of the next cycle. Thus, there is more time for signal development which allows for weaker cells to be able to develop the required signal for sensing. These same cells, however, may not be able to develop the required signal in the typical time allotted for developing the signal.

Another benefit is that a device with weak cells can have its cycle lengthened to provide more time for signal development. Thus, instead of being defective, the device just operates at a longer cycle time. In the case where the time for signal development is self-timed, lengthening the cycle time would not actually provide for more time for signal development. A similar benefit can occur for the case where all of bits are strong so that the time for developing sufficient signal is shorter than average. In such case the cycle can be shortened so that the device can be specified as being faster than the average device. Faster devices generally sell for more. If the time for signal development is self-timed, reducing the cycle time would take time away from some other operation, such as precharging, which may not be able to be reduced.

Also generally signal development on the bit lines is a high sensitivity operation so that signal margin in that operation can be important. Margin on that operation can be achieved simply by increasing the cycle time. If the signal development is self-timed, however, increasing cycle does not have the effect of increasing margin for signal development but rather increasing for an operation, such as precharging, that generally is more tightly controlled and in less need of margin. In other cases where the cell being sensed is strong or the clock cycle is particularly long, the signal developed by the cell may tend to provide more signal than is needed for reliable sensing. Too much signal can make precharging take longer than is desirable and also waste power. Thus, it may be necessary to have a voltage limiter on the bit lines or terminate sensing early in those cases. This can be done by having the sense amplifier detect when there is clearly sufficient signal and begin the termination of sensing on its own. This can be extended to disabling the word line also. In such case the strong cells would themselves cause an early termination of sensing but the weak cells would still have the whole cycle for sensing and terminating in response to the beginning of the next cycle. A simple alternative way to achieve this is simply to disable sense amplifier 20 after a predetermined time that includes sufficient margin for sensing of even weak cells to have occurred. Clock generator 26 can provide such timing of sense amplifier enable signal CSA. Latching of the data may require clock generator 26 to generate a latch signal, a signal different than address clock signal CADD, for data latch 21 to latch the data.

In this example, the address provided in one cycle is actually for a location in the memory that is provided in response to entering the next cycle. The last write cycle before the read cycle can be used to provide the address of the location to be read in the first read cycle. This avoids a wasted cycle at the beginning of series of read cycles or the requirement for two read cycles to perform a single read cycle. Other alternatives than that shown for performing a write may also be used.

A particular advantage of beginning the memory cycle with a precharge is that of being used by a processor having the same system clock CLK. It is common for the processor to generate the address overlapping the cycle boundaries so there is time to latch the address but there would be delay in enabling the selected word line through the decoders. No address is required for precharge, thus precharge can be started at the beginning of the cycle with minimal setup time. This also is conveniently the time of terminating the sensing. Thus, in the situation of an on-board processor there is a particular advantage of having the precharge be initiated in response to the beginning of the cycle.

Various other changes and modifications to the embodiments herein chosen for purposes of illustration will readily occur to those skilled in the art. For example, the external address could be multiplexed in which the row address is first received followed by the column address. In such case the address clock shown in FIG. 2 would still be representative of the whole time that the word line is enabled so that signal is developed. Memory 10 is shown as having a single memory array 12, but memory 10 could have many other memory arrays requiring additional decoding of the external address. Sense amplifier 20 was described as providing a single data out signal but could provide many output signals. Also a single memory cell was described as being selected but more than one could be selected either in the same array as array 12 or in other arrays not shown. The type of precharging was not specified but is typically to the positive power supply voltage but can be chosen to be some other voltage. To the extent that such modifications and variations do not depart from the spirit of the invention, they are intended to be included within the scope thereof which is assessed only by a fair interpretation of the following claims.

The invention claimed is:

1. A method for accessing a memory array, the method comprising:
    beginning a bit line precharge operation based on a clock edge of an external clock signal, wherein the clock edge comprises one of a group consisting of a logic low to logic high transition and a logic high to logic low transition;
    terminating the bit line precharge operation a first predetermined duration after the clock edge that is independent of a clock period of the external clock signal;
    enabling a word line after the terminating of the bit line precharge operation;
    beginning a sense operation after the enabling the word line, the sense operation for sensing a logic state of a memory cell; and
    outputting a data bit from the memory array corresponding to the sensed logic state of the memory cell;

wherein:
    the method is characterized as being self-timed from the step of beginning the bit line precharge to the step of beginning the sense operation and based on the clock edge of the external clock signal; and
    the step of beginning the sense operation is further characterized by beginning a second predetermined duration after the step of enabling the word line begins and by the sense operation having a variable duration.

2. The method of claim 1 further comprising implementing the memory as a static random access memory (SRAM).

3. The method of claim 1, wherein the variable duration is dependent, at least in part, on a clock period of the external clock signal.

4. The method of claim 1, wherein the step of beginning a sense operation further comprises beginning a sense operation using a static sense amplifier.

5. The method of claim 1, wherein the memory array is a read/write memory array.

6. A method comprising:
    providing a memory array having a plurality of memory cells, a memory cell of the plurality of memory cells located at intersections of intersecting bit lines and word lines;
    providing an address to access a memory cell of the plurality of memory cells;
    beginning a bit line precharge operation, the bit line precharge operation based on a clock edge of an external clock signal, the bit line precharge operation having a predetermined duration independent of a clock period of the external clock signal;
    enabling a word line a first predetermined delay after the beginning of the bit line precharge operation;
    beginning a sense operation on the memory cell for accessing at the address provided in the step of providing the address a second predetermined delay after the enabling the word line, the sense operation having a duration based on the clock period of the external clock signal;
    outputting a data bit from the memory array, the data bit corresponding to a logic state of the memory cell sensed during the sense operations; and
    terminating the sense operation after a predetermined time if termination of the clock period has not occurred prior to the predetermined time.

7. The method of claim 6, wherein the step of providing the memory array is further characterized by providing a plurality of static random access memory (SRAM) cells.

8. The method of claim 6, wherein the step of beginning the sense operation further comprises beginning a sense operation using a static sense amplifier.

9. The method of claim 6, wherein the duration increases as the clock period increases.

10. The method of claim 6, wherein the step of outputting the data bit further comprises outputting a data bit within a clock period following the clock edge of the external clock signal.

* * * * *